(12) United States Patent
Shen

(10) Patent No.: US 7,897,984 B2
(45) Date of Patent: Mar. 1, 2011

(54) LIGHT-EMITTING DIODE CHIP PACKAGE BODY AND PACKAGING METHOD THEREOF

(75) Inventor: Yu-Nung Shen, Taipei (TW)

(73) Assignee: Suzhou Industrial Park Tony Lighting Technology Co., Ltd., Suzhou (CN)

( * ) Notice: Subject to any disclaimer, the term of this patent is extended or adjusted under 35 U.S.C. 154(b) by 91 days.

(21) Appl. No.: 12/007,280

(22) Filed: Jan. 9, 2008

(65) Prior Publication Data

US 2008/0105893 A1 May 8, 2008

Related U.S. Application Data

(62) Division of application No. 11/004,910, filed on Dec. 7, 2004, now Pat. No. 7,339,198.

(30) Foreign Application Priority Data

Jan. 16, 2004 (TW) .............................. 93101125 A

(51) Int. Cl.
*H01L 33/00* (2010.01)
*H01L 29/02* (2006.01)

(52) U.S. Cl. .............................. 257/98; 257/88; 257/99; 257/100; 313/501

(58) Field of Classification Search .................. 257/81, 257/98, 88, 99, 100; 438/20, 106, 46, 47, 438/48, 51
See application file for complete search history.

(56) References Cited

U.S. PATENT DOCUMENTS

| | | | | |
|---|---|---|---|---|
| 6,184,544 B1 * | 2/2001 | Toda et al. | | 257/98 |
| 6,614,058 B2 * | 9/2003 | Lin et al. | | 257/99 |
| 6,964,877 B2 * | 11/2005 | Chen et al. | | 438/20 |
| 7,576,366 B2 * | 8/2009 | Shen | | 257/98 |
| 2002/0171087 A1 * | 11/2002 | Krames et al. | | 257/81 |
| 2004/0090161 A1 * | 5/2004 | Noguchi et al. | | 313/152 |
| 2008/0191227 A1 * | 8/2008 | Kimura et al. | | 257/98 |
| 2009/0179207 A1 * | 7/2009 | Chitnis et al. | | 257/88 |
| 2009/0200570 A1 * | 8/2009 | Mori et al. | | 257/99 |

* cited by examiner

*Primary Examiner*—Steven Loke
*Assistant Examiner*—David Goodwin
(74) *Attorney, Agent, or Firm*—Rosenberg, Klein & Lee

(57) ABSTRACT

AN LED chip package body provides an LED chip with a pad-installed surface, a plurality of pads disposed on the pad-installed surface and a rear surface formed opposite the pad-installed surface. The LED chip package body further has a light-reflecting coating disposed on the pad-installed surface of the LED chip and a plurality of pad-exposed holes for exposure of the corresponding pads of the LED chip. The LED chip package body further comprises a light-transparent element disposed on the rear surface of the LED chip and a plurality of conductive projecting blocks. Each of the conductive projecting blocks is disposed on the corresponding pad of the LED chip.

15 Claims, 12 Drawing Sheets

LIGHT-EMITTING DIODE CHIP PACKAGE BODY AND PACKAGING METHOD THEREOF

RELATED APPLICATIONS

This application is a Divisional patent application of application Ser. No. 11/004,910, filed on 7 Dec. 2004, now U.S. Pat. No. 7,339,198.

BACKGROUND OF THE INVENTION

1. Field of the Invention

The present invention relates to a light-emitting diode chip, and especially to a light-emitting diode chip package body and a packaging method of the light-emitting diode chip package body.

2. Description of the Related

In general, the LED (Light-emitting diode) of prior art comprises a package substrate and/or an electric conduction frame and an LED chip disposed on the package substrate and/or the electric conduction frame. The LED chip has a plurality of pads electrically connected to corresponding joining points of the package substrate and/or the electric conduction through corresponding metal wires by wire bonding process. However, the packaging process according to the above packaging method wastes time. Thus, the output and the quality of the LED chip package body will not improve.

Furthermore, the size of the LED is increasingly small with the advancement of the chip process and the area of the pad of the LED chip is increasingly small. Thus, it is hard to carry out the wire bonding process on the small area of the pad.

With the employment of unique considerations and application of theories, and based on several years experience in specialized production of all flexible assembly systems and mechanisms, the inventor has come up with an innovative light-emitting diode chip package body.

SUMMARY OF THE INVENTION

The primary object of the present invention is to provide a light-emitting diode chip package body and a packaging method of the light-emitting diode chip package body. The light-emitting diode chip package body and the packaging method of the light-emitting diode chip package body are used to resolve the problems of the pad of the LED chip of the prior art.

In order to achieve the above objects, the present invention provides a light-emitting diode chip package body comprising a light-emitting diode chip having a pad-installed surface formed thereon, a plurality of pads installed on the pad-installed surface and a rear surface formed on an opposite side of the pad-installed surface; a light-reflecting coating disposed on the pad-installed surface and having a plurality of pad-exposed holes for exposure of the corresponding pads of the light-emitting diode; a surface insulation layer disposed on the rear surface of the light-emitting diode chip and having a central through hole for exposure of a central portion of the rear surface; a first light-transparent element received in the central through hole of the surface insulation layer; and a plurality of conductive projecting blocks, each of the conductive projecting blocks disposed on the corresponding pad of the light-emitting diode.

In order to achieve the above objects, the present invention provides a light-emitting diode chip package body comprising a light-emitting diode chip having a pad-installed surface formed thereon, a plurality of pads installed on the pad-installed surface and a rear surface formed on an opposite side of the pad-installed surface; a light-reflecting coating disposed on the rear surface of the light-emitting diode chip; an insulative protective layer formed on the light-reflecting coating; a surface insulation layer disposed on the rear surface of the light-emitting diode chip, and having a central through hole for exposure of a central portion of the rear surface and a plurality of pad-exposed holes for exposure of the corresponding pads; a first light-transparent element received in the central through hole of the insulative protective layer; and a plurality of conductive projecting blocks, each of the conductive projecting blocks disposed on the corresponding pad of the light-emitting diode.

In order to achieve the above objects, the present invention provides a light-emitting diode chip package body comprising an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole; a substrate insulative layer disposed on the chip-installed surface to form an open hole for exposure of a central scope of the at least one chip-installed scope; at least one light-emitting diode chip disposed on the at least one chip-installed scope of the insulative substrate, and having a pad-installed surface formed thereon, a plurality of pads installed on the pad-installed surface and a rear surface formed on an opposite side of the pad-installed surface; a light-reflecting coating disposed on the pad-installed surface and having a plurality of pad-exposed holes for exposure of the corresponding pads of the at least one light-emitting diode chip; a plurality of conductive projecting blocks, each of the conductive projecting blocks disposed on the corresponding pad of the at least one light-emitting diode chip and electrically connected to the corresponding conductive tracks; a heat-conducting layer formed between the insulative substrate and the at least one light-emitting diode chip; and a light-transparent element disposed on the rear face of the at least one light-emitting diode chip.

In order to achieve the above objects, the present invention provides a light-emitting diode chip package body comprising an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole; a substrate insulative layer disposed on the chip-installed surface to form an open hole for exposure of a central scope of the at least one chip-installed scope; at least one light-emitting diode chip disposed on the at least one chip-installed scope of the insulative substrate, and having a pad-installed surface formed thereon, a plurality of pads installed on the pad-installed surface and a rear surface formed on an opposite side of the pad-installed surface; a heat-conducting layer formed between the insulative substrate and the at least one light-emitting diode chip; an insulative material layer disposed between the internal wall of each of the open holes and the corresponding conductive body, the insulative material layer being thicker near the at least one light-emitting diode chip and thinner near the substrate insulative layer, so that the insulative material layer has a concave top face; a metal reflecting layer formed on the insulative material layer; a transparent protection layer formed on the metal reflecting layer; and a plurality of conductive projecting blocks, each of the conductive projecting blocks disposed on the corresponding pad of the at least one light-emitting diode chip and electrically connected to the corresponding conductive tracks.

In order to achieve the above objects, the present invention provides a light-emitting diode chip package body comprising a light-emitting diode chip having a pad-installed surface formed thereon, a plurality of pads installed on the pad-installed surface and a rear surface formed on an opposite side of the pad-installed surface; a light-reflecting coating disposed on the pad-installed surface and having a plurality of pad-exposed holes for exposure of the corresponding pads of the light-emitting diode; a first light-transparent element disposed on the rear face of the light-emitting diode chip; and a plurality of conductive projecting blocks, each of the conductive projecting blocks disposed on the corresponding pad of the light-emitting diode.

In order to achieve the above objects, the present invention provides a packaging method of a light-emitting diode chip package body, the packaging method comprising providing a light-emitting diode chip having a pad-installed surface formed thereon, a plurality of pads installed on the pad-installed surface and a rear surface formed on an opposite side of the pad-installed surface; setting a light-reflecting coating on the pad-installed surface, the light-reflecting coating having a plurality of pad-exposed holes for exposure of the corresponding pads of the light-emitting diode; forming a surface insulation layer on the rear surface of the light-emitting diode chip, the surface insulation layer having a central through hole for exposure of a central portion of the rear surface; setting a first light-transparent element in the central through hole of the surface insulation layer; and setting a plurality of conductive projecting blocks, with each of the conductive projecting blocks disposed on the corresponding pad of the light-emitting diode.

In order to achieve the above objects, the present invention provides a packaging method of a light-emitting diode chip package body, the packaging method comprising providing a light-emitting diode chip having a pad-installed surface formed thereon, a plurality of pads installed on the pad-installed surface and a rear surface formed on an opposite side of the pad-installed surface; setting a light-reflecting coating on the rear surface of the light-emitting diode chip; forming an insulative protective layer on the light-reflecting coating; forming an insulative layer on the pad-installed surface of the light-emitting diode chip, the insulative layer having a central through hole for exposure of a central portion of the pad-installed surface and plurality of pad-exposed holes for exposure of the corresponding pads; setting a first light-transparent element in the central through hole of the insulation layer; and setting a plurality of conductive projecting blocks, each of the conductive projecting blocks being disposed on the corresponding pad of the light-emitting diode.

In order to achieve the above objects, the present invention provides a packaging method of a light-emitting diode chip package body, the packaging method comprising providing an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole; setting a substrate insulative layer on the chip-installed surface to form an open hole for exposure of a central scope of the at least one chip-installed scope; setting at least one light-emitting diode chip on the at least one chip-installed scope of the insulative substrate, the at least one light-emitting diode chip having a pad-installed surface formed thereon, a plurality of pads installed on the pad-installed surface and a rear surface formed on an opposite side of the pad-installed surface; setting a light-reflecting coating on the pad-installed surface, the light-reflecting coating having a plurality of pad-exposed holes for exposure of the corresponding pads of the at least one light-emitting diode chip; setting a plurality of conductive projecting blocks, each of the conductive projecting blocks being disposed on the corresponding pad of the at least one light-emitting diode chip and electrically connected to the corresponding conductive tracks; forming a heat-conducting layer between the insulative substrate and the at least one light-emitting diode chip; and setting a light-transparent element on the rear face of the at least one light-emitting diode chip.

In order to achieve the above objects, the present invention provides a packaging method of a light-emitting diode chip package body, the packaging method comprising providing an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole; setting a substrate insulative layer on the chip-installed surface to form an open hole for exposure of a central scope of the at least one chip-installed scope; setting at least one light-emitting diode chip on the at least one chip-installed scope of the insulative substrate, the at least one light-emitting diode chip having a pad-installed surface formed thereon, a plurality of pads installed on the pad-installed surface and a rear surface formed on an opposite side of the pad-installed surface; forming a heat-conducting layer between the insulative substrate and the at least one light-emitting diode chip; setting an insulative material layer between the internal wall of each of the open holes and the corresponding conductive body, the insulative material layer being thicker near the at least one light-emitting diode chip and thinner near the substrate insulative layer, so that the insulative material layer has a concave top face; forming a metal reflecting layer on the insulative layer; forming a transparent protection layer on the metal reflecting layer; and setting a plurality of conductive projecting blocks, each of the conductive projecting blocks being disposed on the corresponding pad of the at least one light-emitting diode chip and electrically connected to the corresponding conductive tracks.

In order to achieve the above objects, the present invention provides a packaging method of a light-emitting diode chip package body, the packaging method comprising providing a light-emitting diode chip having a pad-installed surface formed thereon, a plurality of pads installed on the pad-installed surface and a rear surface formed on an opposite side of the pad-installed surface; setting a light-reflecting coating on the pad-installed surface, the light-reflecting coating having a plurality of pad-exposed holes for exposure of the corresponding pads of the light-emitting diode; setting a first light-transparent element on the rear face of the light-emitting diode chip; and setting a plurality of conductive projecting blocks, each of the conductive projecting blocks being disposed on the corresponding pad of the light-emitting diode.

It is to be understood that both the foregoing general description and the following detailed description are exemplary, and are intended to provide further explanation of the invention as claimed. Other advantages and features of the invention will be apparent from the following description, drawings and claims.

BRIEF DESCRIPTION OF THE DRAWINGS

The various objects and advantages of the present invention will be more readily understood from the following detailed description when read in conjunction with the appended drawing, in which.

DETAILED DESCRIPTION OF PREFERRED EMBODIMENTS

Referring to FIGS. 1 to 4, the first embodiment of the present invention provides an LED chip package and a packaging method of the LED chip package.

Figure 1:
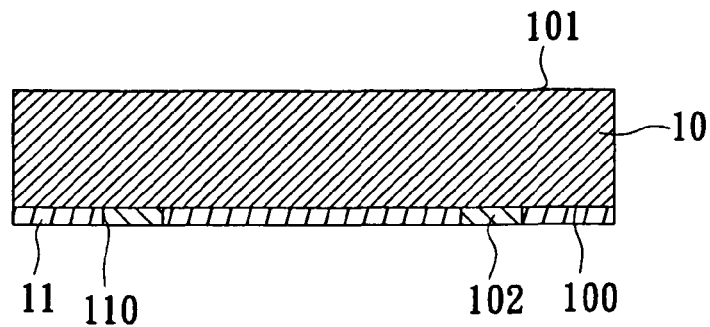
FIGS. 1 to 4 are schematic, cross-sectional views of the LED chip package body according to the steps of the first embodiment of the present invention.

Referring to FIG. 1, the steps of the first embodiment provide a light-emitting diode (LED) chip 10. The LED chip 10 is or is not cut from a wafer and has a pad-installed surface 100, a plurality of pads 102 disposed on the pad-installed surface 100 and a rear surface 101 disposed opposite the pad-installed surface 100.

The steps of the first embodiment comprise forming a light-reflecting coating 11 on the pad-installed surface 100 with a plurality of pad-exposed holes 110 for exposure of the corresponding pads 102.

Figure 2:
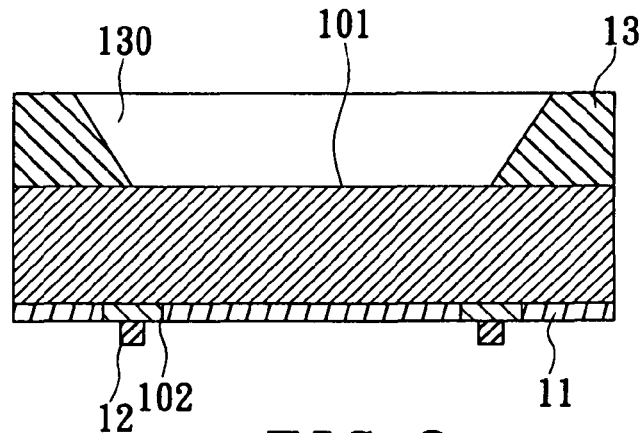

Referring to FIG. 2, the steps of the first embodiment comprise setting a plurality of protrusions 12 on the corresponding pads 102, after forming the light-reflecting coating 11 on the pad-installed surface 100. The protrusions 12 are made of a photoresist material like a polyimide. First, photoresist material is used to form a protrusion layer (not shown in drawing) on the light-reflecting coating 11, then the protrusions 12 are formed from the protrusion layer by a development and exposure process.

The steps of the first embodiment comprise forming a surface insulative housing 13 on the rear surface 101 of the LED chip 10. The surface insulative housing 13 is made of a photoresist material like a sensitization printing ink. After forming the surface insulative housing 13 on the rear surface 101, a central through hole 130 is formed for exposure of a central portion of the rear surface 101 by a development and exposure process.

Figure 3:
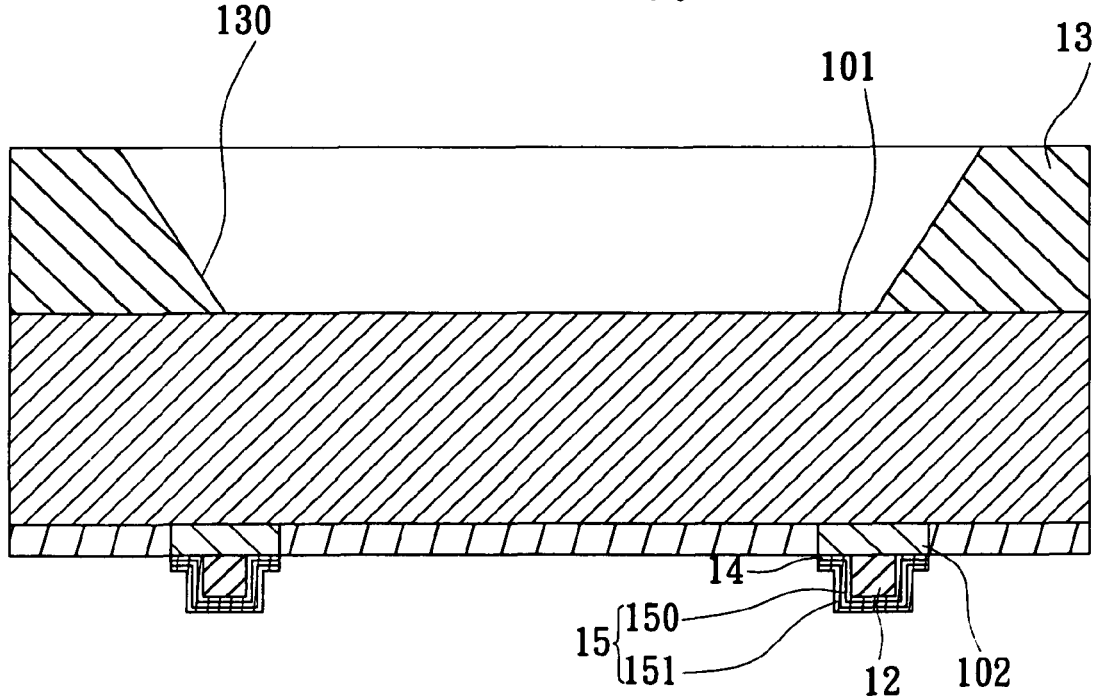

Referring to FIG. 3, the steps of the first embodiment comprise forming a first metal layer 14 on each of the pads 102 for covering a surface of the corresponding pad 102 and the corresponding protrusion 12. The first metal layer 14 is made of any metal material like aluminum.

Then, the steps of the first embodiment comprise forming a second metal layer 15 on the first metal layer 14. Each of the protrusions 12 and the corresponding first and second metal layers 14, 15 are formed together to form a conductive projecting block. Each of the second metal layers 15 is composed of a nickel layer 150 and a gold layer 151.

Figure 4:
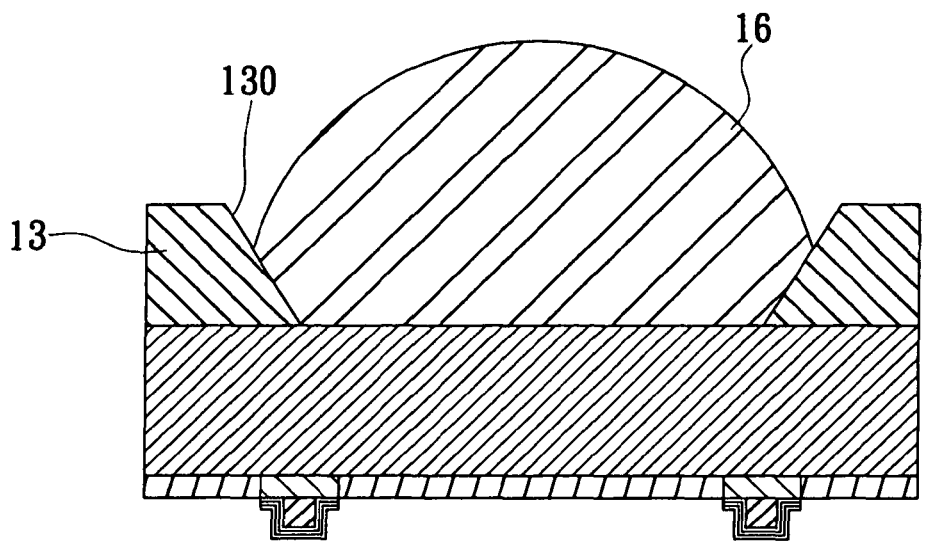

Referring to FIG. 4, the steps of the first embodiment comprise setting a light-transparent element 16 in the central through hole 130 of the surface insulative layer 13. The light-transparent element 16 is made of a polyimide and has a cambered top portion. The light-transparent element 16 has light-polarizing compound with different wavelengths doped therein to provide light passing through the light-transparent element 16 with good color.

Figure 10:
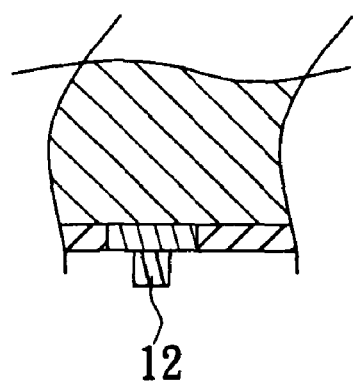
FIG. 10 is a schematic, cross-sectional view of another conductive projecting block of the present invention.
Figure 11:
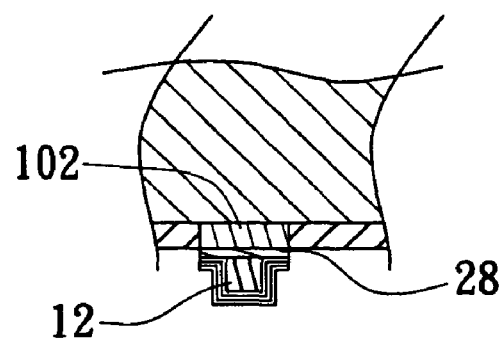
FIG. 11 is a schematic, cross-sectional view of another conductive projecting block of the present invention.

Referring to FIG. 10, the protrusion 12 is made of metal material like gold to form the conductive projecting block. When the protrusion 12 is made of gold, the conductive projecting block is formed without using the first and second metal layer 14, 15. Referring to FIG. 11, the steps of the present invention comprises forming a bonded metal layer 28 on each of the pads 102, before using the photoresist to form the protrusion 12. The protrusion 12 is formed by any processing method in the present invention.

Above the LED chip package and the packaging method of the LED chip package body have some advantages, comprising:

1. The size of the LED chip package body is similar to the LED chip, so that the size of the LED chip package body is smaller than "0603", "0804" and "0402" LED chip package bodies on the market.
2. The packaging method of the LED chip package body is made without a wire bonding process, so that the output and the quality of the LED chip package body are improved.

Figure 5:
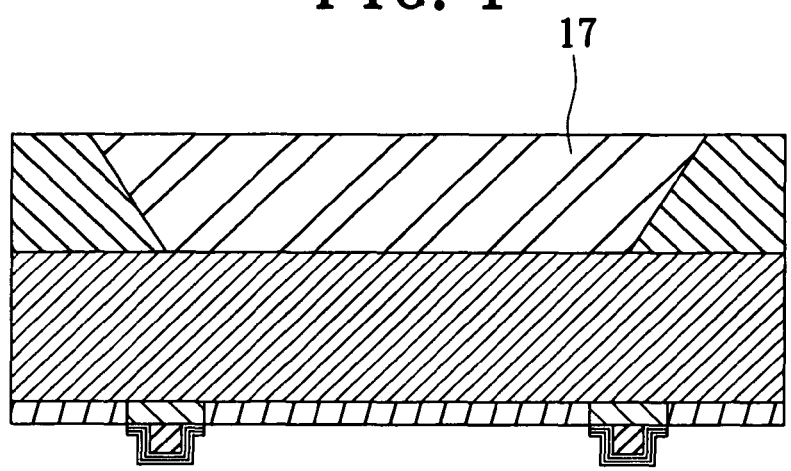
FIG. 5 is a schematic, cross-sectional view of the LED chip package body according to the second embodiment of the present invention.

Referring to FIG. 5, the second embodiment of the present invention provides a light-transparent element 17 with side portion ground to form a planar side portion by a grinding process.

Figure 6:
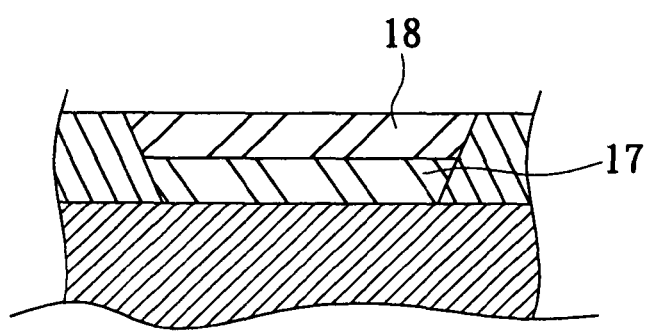
FIG. 6 is a schematic, cross-sectional view of the LED chip package body according to the third embodiment of the present invention.

Referring to FIG. 6, the third embodiment of the present invention further comprises a second light-transparent element 18 disposed on the first light-transparent element 17. Both the first and the second light-transparent element 17, 18 have a light-polarizing compound with different wavelengths doped therein to provide light passing through the first and second light-transparent element 17, 18 with a good mixing color.

Figure 7:
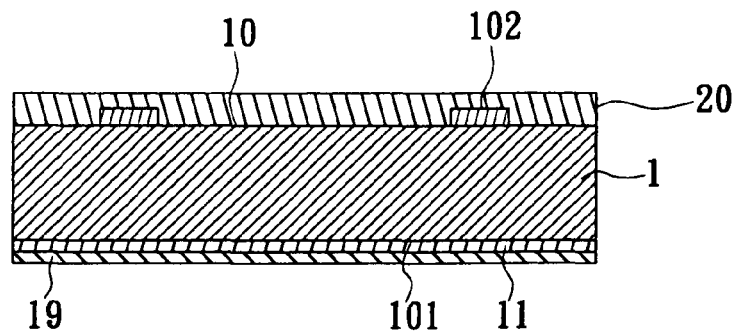
FIGS. 7 to 9 are schematic, cross-sectional views of the LED chip package body according to the steps of the fourth embodiment of the present invention.
Figure 8:
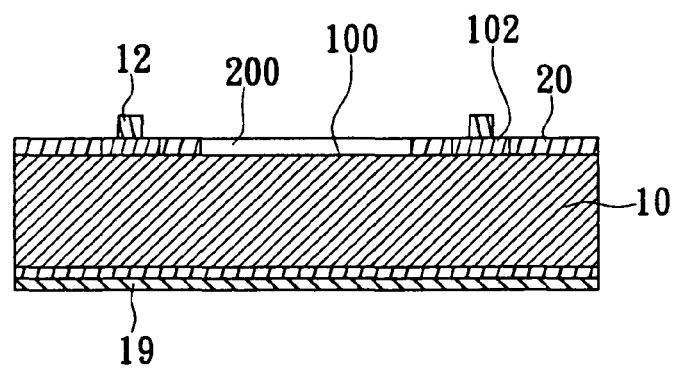
Figure 9:
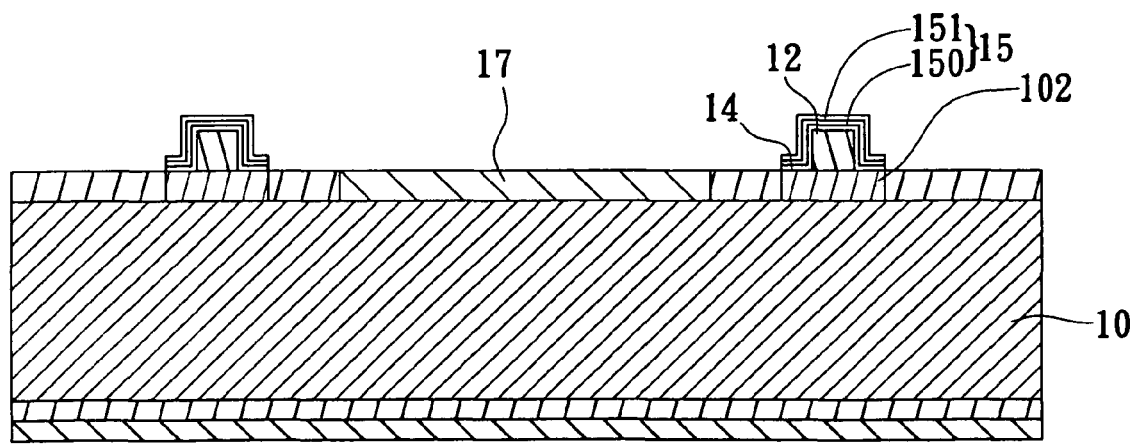

Referring to FIGS. 7 to 9, the fourth embodiment of the present invention provides an LED chip package and a packaging method of the LED chip package.

Referring to FIG. 7, the steps of the fourth embodiment provide a light-emitting diode (LED) chip 10 having a pad-installed surface 100, a plurality of pads 102 disposed on the pad-installed surface 100 and a rear surface 101 disposed opposite the pad-installed surface 100.

The steps of the fourth embodiment further provide a light-reflecting coating 11 formed on the rear surface 101 of the LED chip 10, forming an insulative protective layer 19 on the light-reflecting coating 11, and forming an insulative layer 20 on the pad-installed surface 100 of LED chip 10. Both the insulative protective layer 19 and the insulative layer 20 are made of a photoresist material like a sensitization printing ink.

Referring to FIG. 8, after the insulative layer 20 is formed on the pad-installed surface 100, a central through hole 200 is formed in the insulative layer 20 for exposure of a central portion of the pad-installed surface 100 and a plurality of protrusions 12 is disposed on the corresponding pads 102 by a development and exposure process.

Referring to FIG. 9, the steps of the fourth embodiment further comprise forming a first metal layer 14 on each of the pads 102 for covering a surface of the corresponding pad 102 and the corresponding protrusion 12. The first metal layer 14 is made of any metal material like aluminum.

Then, the steps of the fourth embodiment further comprise forming a second metal layer 15 on the first metal layer 14. Each protrusion 12 and the corresponding first and second metal layers 14, 15 are formed together to form a conductive projecting block. Each of the second metal layers 15 is composed of a nickel layer 150 and a gold layer 151.

Finally, a light-transparent element 17 is received in the central through hole 200 of the insulative layer 20. The light-transparent element 17 is made of any material or polyimide.

Referring to FIGS. 12 to 18, the fifth embodiment of the present invention provides an LED chip package and a packaging method of the LED chip package.

Figure 12:
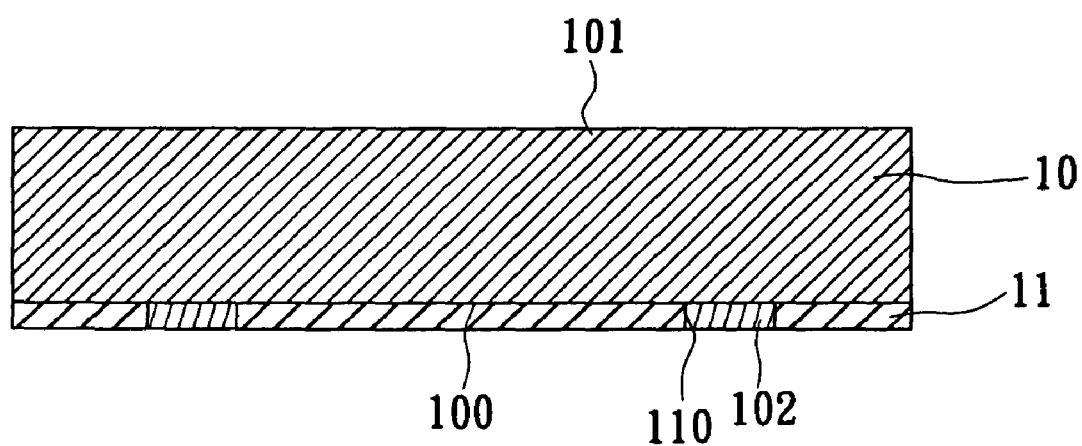
FIGS. 12 to 18 are schematic, cross-sectional views of the LED chip package body according to the steps of the fifth embodiment of the present invention.
Figure 13:
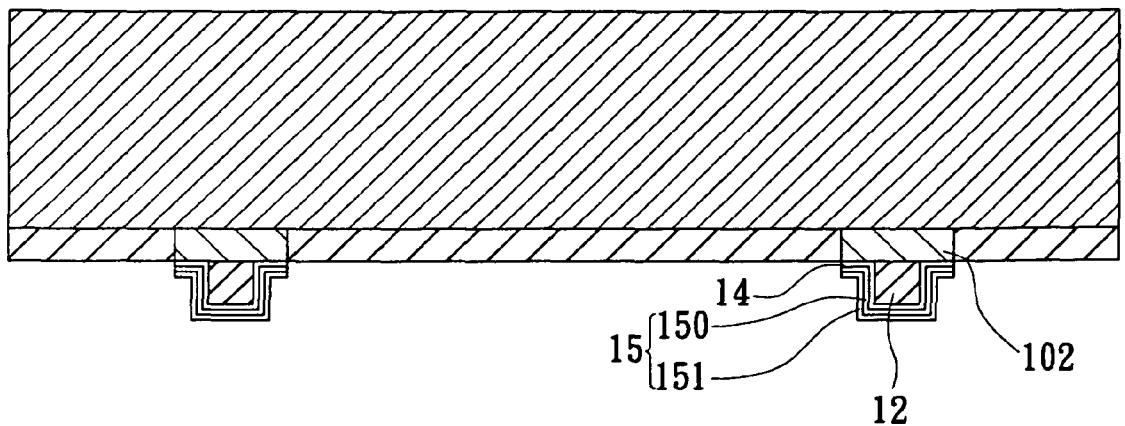

Referring to FIGS. 12 and 13, the steps of the fifth embodiment provide at least one light-emitting diode chip 10 having a pad-installed surface 100, a plurality of pads 102 disposed on the pad-installed surface 100 and a rear surface 101 disposed opposite the pad-installed surface 100.

The steps of the fifth embodiment further comprise forming a light-reflecting coating 11 on the pad-installed surface 100. The light-reflecting coating 11 has a plurality of pad-exposed holes 110 for exposure of the corresponding pads 102.

The steps of the fifth embodiment further comprise forming a plurality of protrusions 12 on the corresponding pads 102, after forming the light-reflecting coating 11 on the pad-installed surface 100. The protrusions 12 are made of a photoresist like polyimide. First, photoresist material is used to form a protrusion layer (not shown in drawing) on the light-reflecting coating 11, then the protrusion layer is developed and exposed to form the protrusions 12.

The steps of the fifth embodiment further comprise forming a first metal layer 14 on each of the pads 102 for covering a surface of the corresponding pad 102 and the corresponding protrusion 12. The first metal layer 14 is made of any metal material like aluminum.

The steps of the fifth embodiment further comprise forming a second metal layer 15 on the first metal layer 14. Each of the protrusions 12 and the corresponding first and second metal layers 14, 15 are formed together to form a conductive projecting block. Each of the second metal layers 15 is composed of a nickel layer 150 and a gold layer 151.

Figure 14:
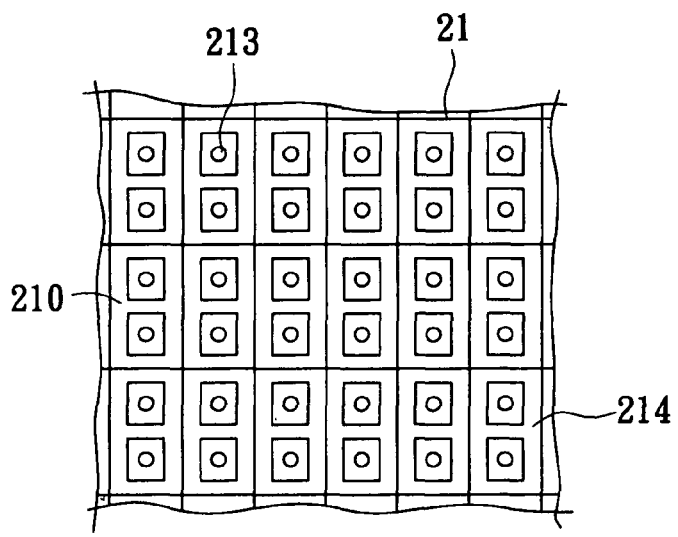
Figure 15:
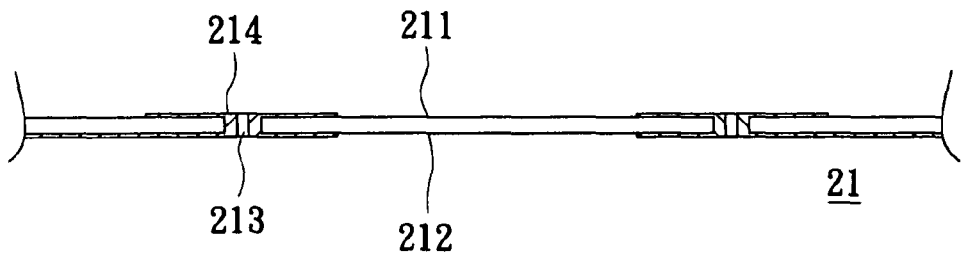

Referring to FIGS. 14 and 15, the steps of the fifth embodiment provide an insulative substrate 21. The insulative substrate 21 has a plurality of chip-installed scopes 210. Each of the chip-installed scopes 210 has a chip-installed surface 211, a rear face 212 formed opposite the chip-installed surface 211, a through hole 213 penetrating through the chip-installed surface 211 and the rear face 212, and a plurality of conductive tracks 214 extending from the chip-installed surface 211 to the rear face 212 through the through hole 213. The number of the through holes 213 is the same as that of the corresponding pads 102 of the LED chip 10.

The insulative substrate 21 is made of ceramic substrate or any insulative substrate like glass substrate.

Figure 16:
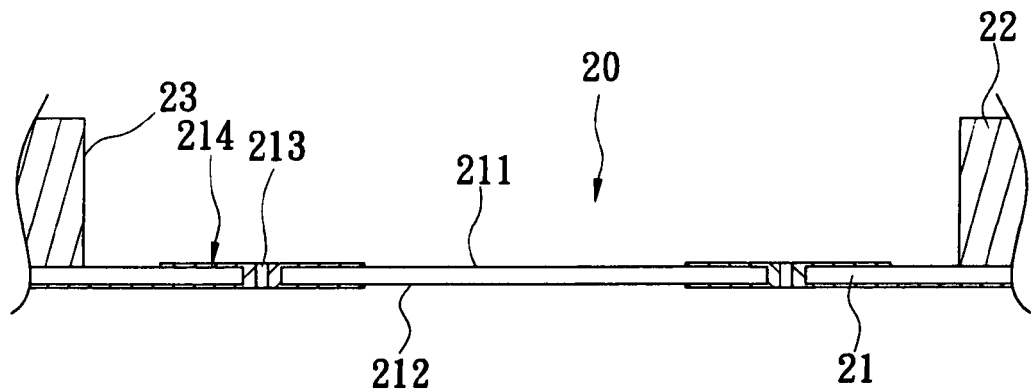

Referring to FIG. 16, the steps of the fifth embodiment further comprise forming a substrate insulative layer 22 on the chip-installed surface 211 of the insulative substrate 21. The substrate insulative layer 22 is made of a photoresist material and has a plurality of open holes 220 for exposure of a central area of the corresponding chip-installed scopes 210 by a development and exposure process. Then, the steps of the fifth embodiment further comprise forming a light-reflecting coating 23 on an internal wall of each of the open holes 220.

Figure 17:
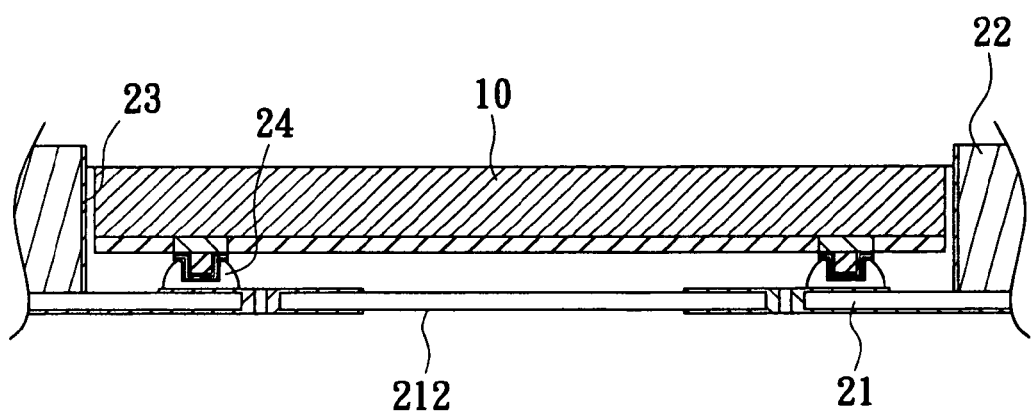

Referring to FIG. 17, the LED chip 10 is received in the chip-installed scope 210. Each of the conductive projecting blocks is disposed on the corresponding pads 102 and electrically connected to the corresponding conductive tracks 214 by a conductive body 24.

Figure 18:
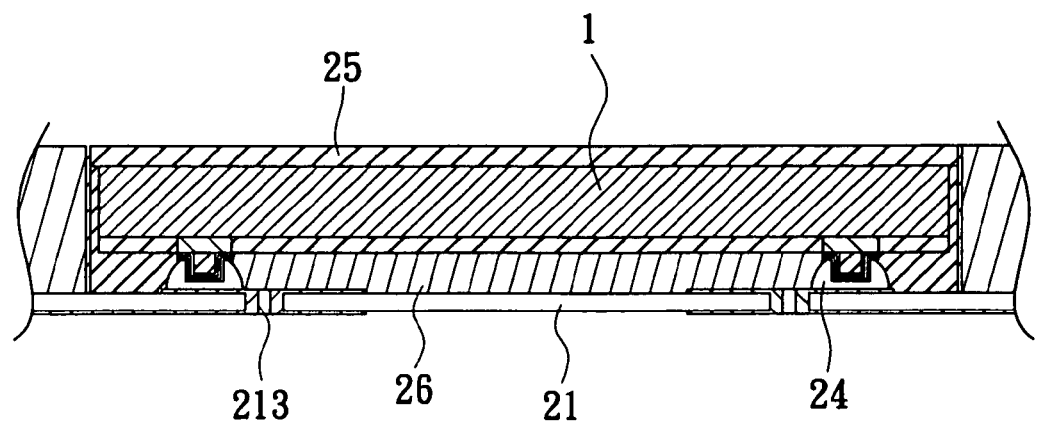

Referring to FIG. 18, the steps of the fifth embodiment further comprise forming a heat-conducting layer 26 between the insulative substrate 21 and the at least one LED chip 10, and two opposite conductive bodies 24 by a heat-conducting material through the through holes 213. The heat-conducting material is a metal-insulator and heat-conductive material or a non-metal-insulator and heat-conductive material.

Then, a light-transparent element 25 is disposed on each of the LED chip 10. The light-transparent element 25 is made of any material or polyimide.

The light-transparent element 25 has light-polarizing compound with different wavelengths doped therein to provide light passing through the light-transparent element 25 with good color.

Finally, the insulative substrate 21 is cut to form a plurality of LED chip package bodies. For example, each of the LED chip package bodies has a chip-installed scope 210 or nine chip-installed scope 210 disposed in a matrix.

Figure 19:
FIGS. 19 to 21 are schematic, cross-sectional views of the LED chip package body according to the steps of the sixth embodiment of the present invention.
Figure 20:
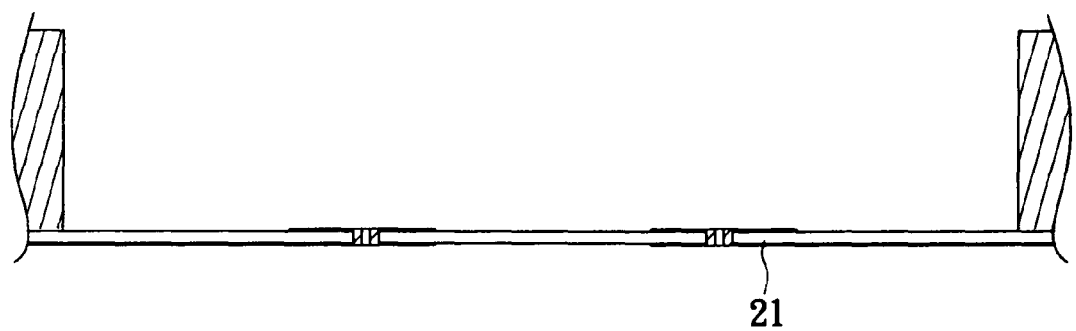
Figure 21:
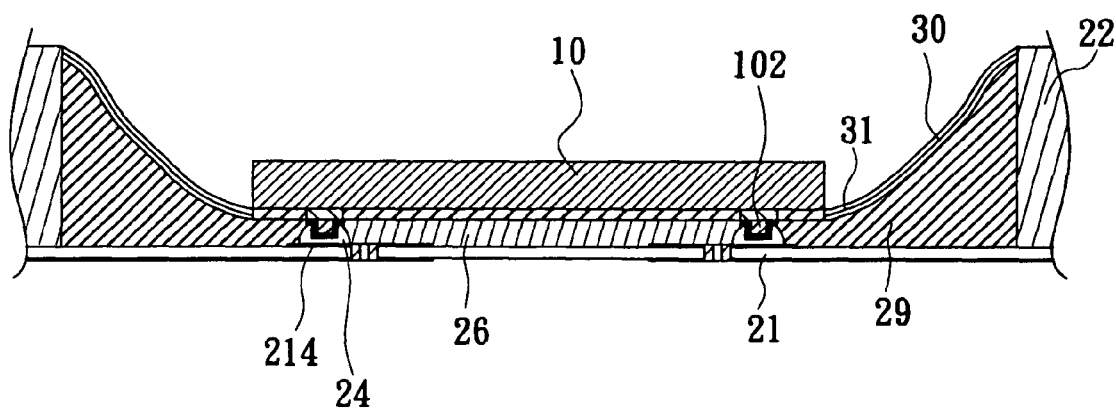

Referring to FIGS. 19 to 21, the sixth embodiment of the present invention provides an LED chip package and a packaging method of the LED chip package.

Referring to FIG. 19, the steps of the sixth embodiment provide an insulative substrate 21 with a chip-installed scope 210. The chip-installed scope 210 has a area larger than that of the chip-installed scope 210 of the fifth embodiment.

Referring to FIG. 20, the steps of the sixth embodiment provide an LED chip 10 and an insulative substrate 21. The insulative substrate 21 has a plurality of chip-installed scopes 210. Each of the chip-installed scopes 210 has a chip-installed surface 211, a rear face 212 formed opposite the chip-installed surface 211, a through hole 213 penetrating through the chip-installed surface 211 and the rear face 212, and a plurality of conductive tracks 214 extending from the chip-installed surface 211 to the rear face 212 through the through hole 213. The number of the through holes 213 is the same as that of the corresponding pads 102 of the LED chip 10.

The steps of the sixth embodiment further comprise forming a substrate insulative layer 22 on the chip-installed surface 211 of the insulative substrate 21.

Referring to FIG. 21, the LED chip 10 is received in the chip-installed scope 210. Each of the conductive projecting blocks is disposed on the corresponding pads 102 and electrically connected to the corresponding conductive tracks 214 by a conductive body 24.

The steps of the sixth embodiment further comprise forming a heat-conducting layer 26 between the insulative substrate 21 and the at least one LED chip 10, and two opposite conductive bodies 24 by a heat-conducting material through the through holes 213. The heat-conducting material is a metal-insulator and heat-conductive material or a non-metal-insulator and heat-conductive material.

After forming the heat-conducting layer 26, the steps of the sixth embodiment further comprise forming an insulative material layer 29 between the internal wall of each of the open holes 220 and the corresponding conductive body 24. The insulative material layer 29 is thinner near the LED chip 10 and thicker near the substrate insulative layer 22, so that the insulative material layer 29 has a concave top face.

The steps of the sixth embodiment further comprise forming a metal reflecting layer 30 formed on the insulative material layer 29 and a transparent protection layer 31 on the metal reflecting layer 30. The metal reflecting layer 30 is used as a reflective mirror to reflect light from the LED chip 10. Finally, the insulative substrate 21 is cut to form a plurality of LED chip package bodies.

Figure 22:
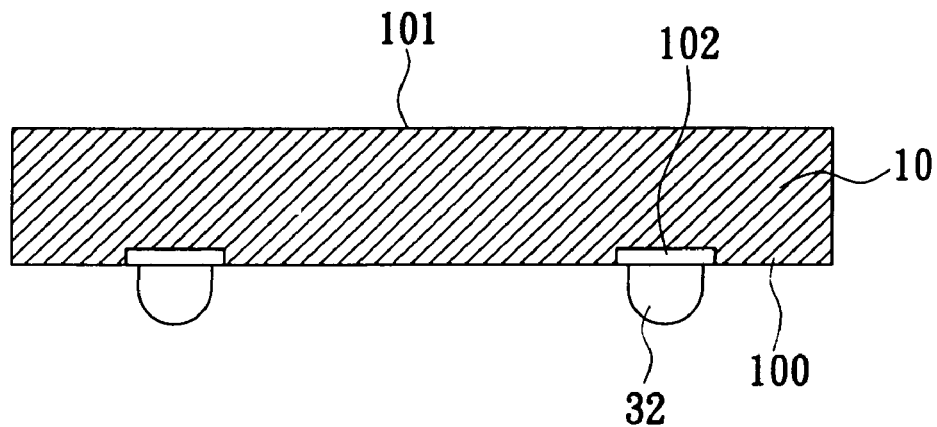
FIGS. 22 to 27 are schematic, cross-sectional views of another conductive projecting block according to the steps of the present invention.

FIGS. 22 to 27 shows the steps of another conductive projecting block. Referring to FIG. 22, the steps of the conductive projecting block provide a conductive contact point 32 (like a conductive metal ball) arranged on each of the pads 102 of the LED chip 10. The conductive contact point 32 is a gold ball and can be made of any metal materials.

Figure 23:
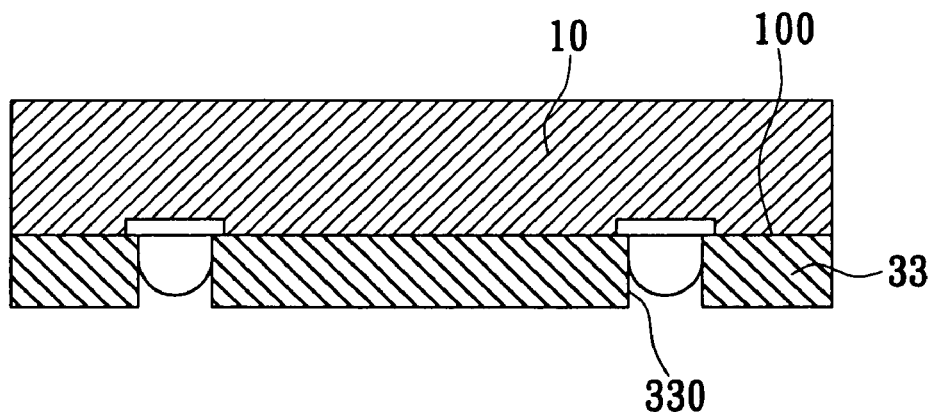

Referring to FIG. 23, the steps of another conductive projecting block further comprise forming a first insulative layer 33 on the pad-installed surface 100 of the LED chip 10. The first insulative layer 33 is made of a sensitization material and has a plurality of open holes 330 for exposure of the corresponding conductive contact points 32.

Figure 24:
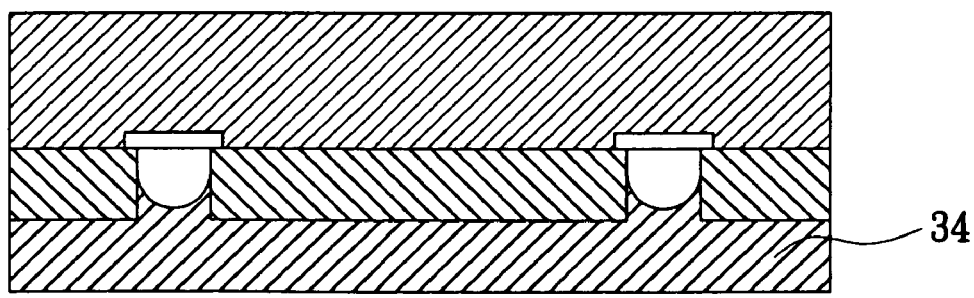
Figure 25:
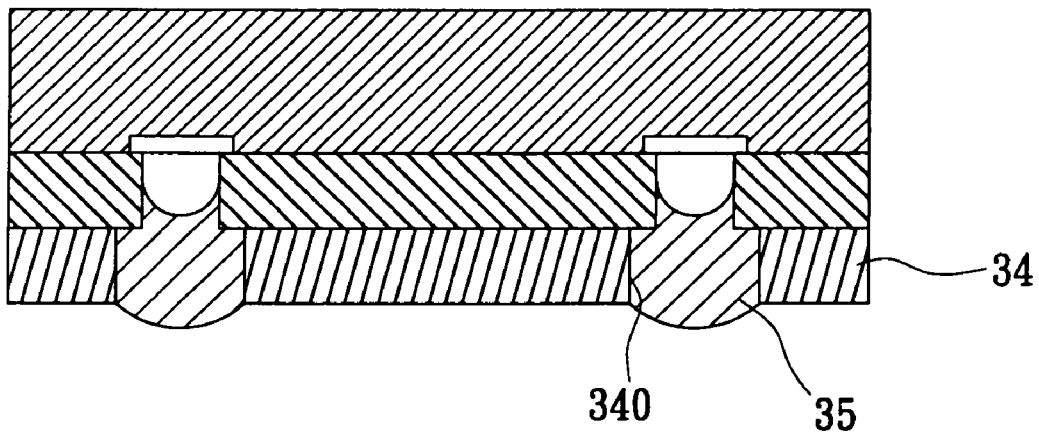

Referring to FIGS. 24 and 25, the steps of another conductive projecting block further comprise forming a second insulative layer 34 on the first insulative housing 33. The second insulative layer 34 has a plurality of through holes 340 communicating with the corresponding open holes 330. The through hole 340 has a diameter larger than that of the open hole 330. Then, the steps of the conductive projecting block further comprise filling the open hole 330 and the through hole 340 with tin solder and forming a conductive welded point 35 to connect electrically to the corresponding conductive contact point 32 by a reflow process. The conductive welded point 35 has a side portion projecting out of the through hole 340.

Figure 26:
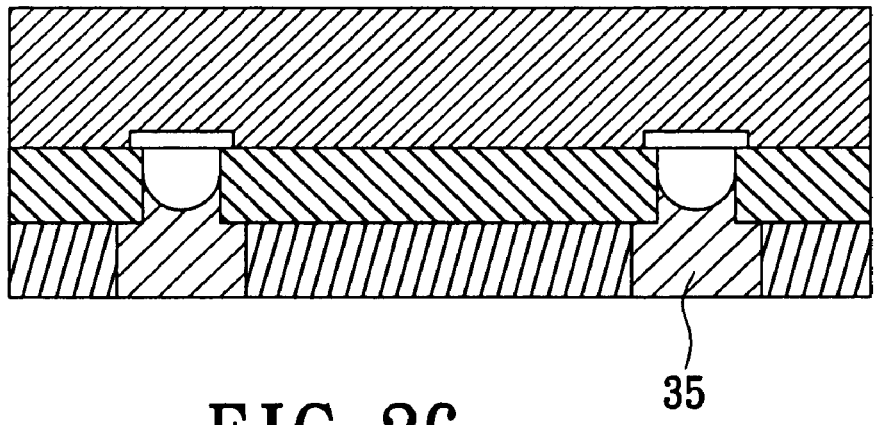

Referring to FIG. 26, the side portion of the conductive welded point 35 is projecting out of the through hole 340 and is ground to form a planar side portion by a grinding process.

Figure 27:
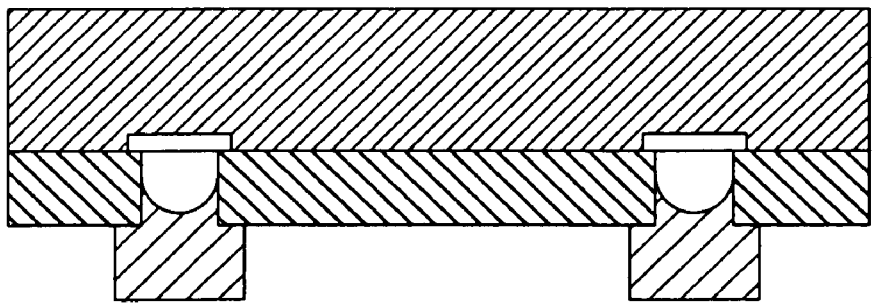
Figure 28:
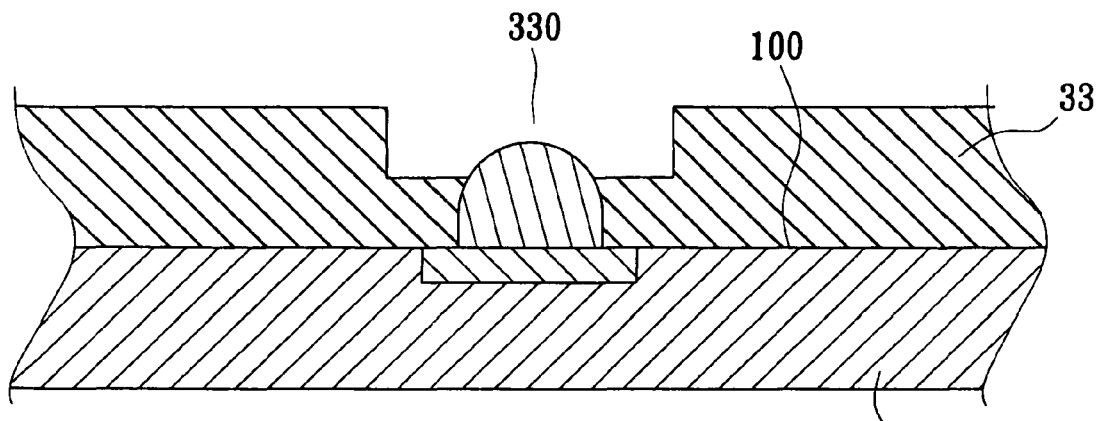
FIGS. 28 to 32 are schematic, cross-sectional views of another conductive projecting block according to the steps of the present invention.

Referring to FIG. 27, the steps of another conductive projecting block finally comprise eliminating the second insulative layer 34 from the first insulative layer 33. Thus, each of the conductive welded points 35 and the corresponding conductive contact point 32 are joined to each other to form the conductive projecting block. FIGS. 28 to 32 show the steps of another conductive projecting block. Referring to FIG. 28, the steps of the conductive projecting block provide a conductive contact point 32 (like a conductive metal ball) arranged on each of the pads 102 of the LED chip 10. The conductive contact point 32 is a gold ball and can be made of any metal materials.

Then, the steps of another conductive projecting block further comprise forming a first insulative layer 33 on the pad-installed surface 100 of the LED chip 10. The first insulative layer 33 is made of a sensitization material and has a plurality of open holes 330 for exposure of the corresponding conductive contact points 32.

Figure 29:
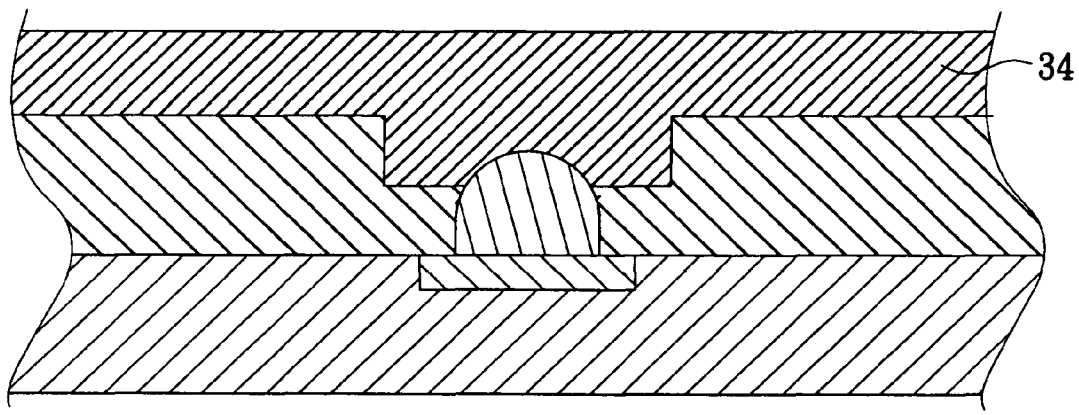
Figure 30:
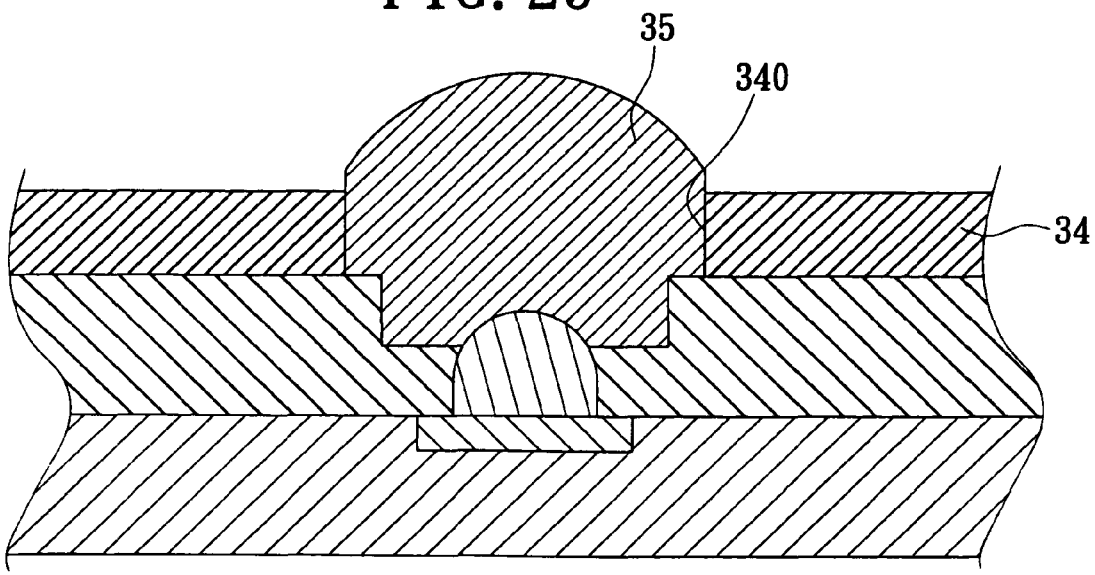

Referring to FIGS. 29 and 30, the steps of another conductive projecting block further comprise forming a second insulative layer 34 on the first insulative housing 33. The second insulative layer 34 has a plurality of through holes 340 communicating with the corresponding open holes 330. The through hole 340 has a diameter larger than that of the open hole 330. Then, the steps of the conductive projecting block further comprise filling the open hole 330 and the through hole 340 with tin solder and forming a conductive welded point 35 to connect electrically to the corresponding conductive contact point 32 by a reflow process. The conductive welded point 35 has a side portion projecting out of the through hole 340.

Figure 31:
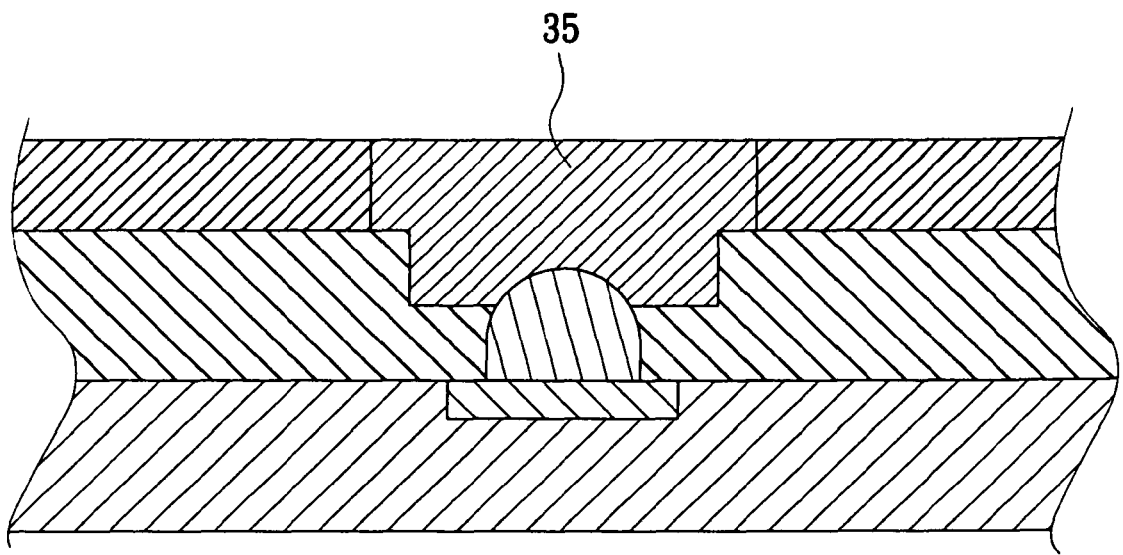

Referring to FIG. 31, the side portion of the conductive welded point 35 is projecting out of the through hole 340 and is ground to form a planar side portion by a grinding process.

Figure 32:
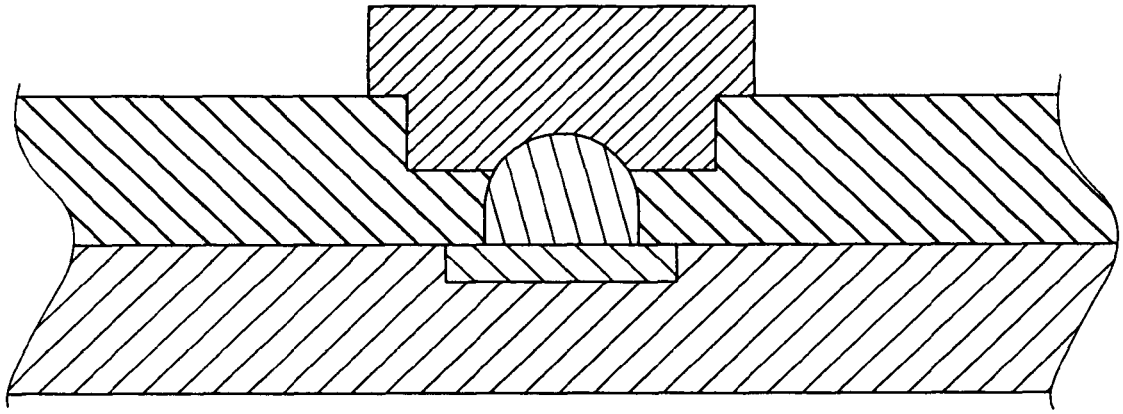

Referring to FIG. 32, the steps of another conductive projecting block finally comprise eliminating the second insulative layer 34 from the first insulative layer 33. Thus, each of the conductive welded points 35 and the corresponding conductive contact point 32 are joined to each other to form the conductive projecting block.

Figure 33:
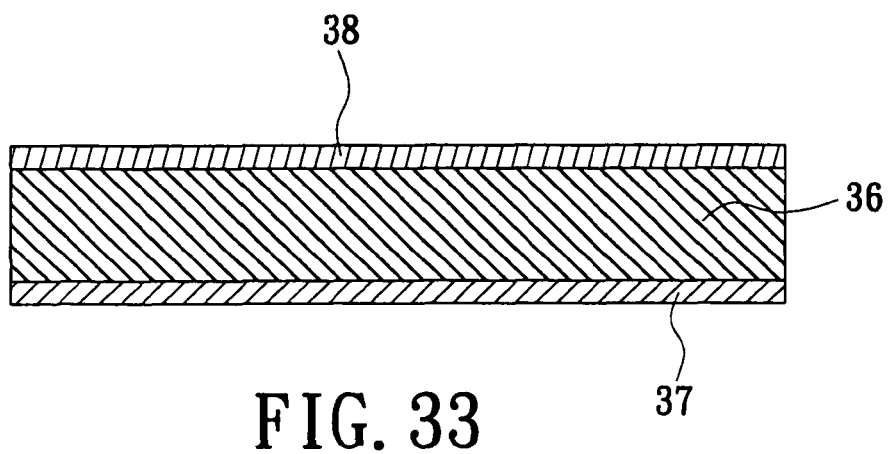
FIGS. 33 to 34 are schematic, cross-sectional views of the LED chip package body according to the steps of the seventh embodiment of the present invention.
Figure 34:
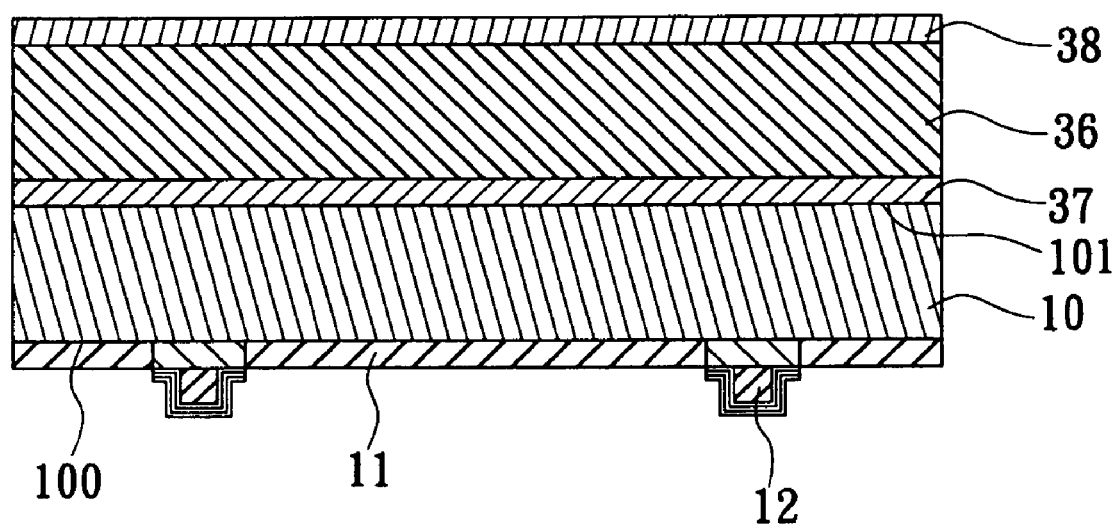

Referring to FIGS. 33 to 34, the seventh embodiment of the present invention provides an LED chip package and a packaging method of the LED chip package.

First, the steps of the seventh embodiment provide an LED chip 10 according to the FIGS. 12 to 13 and a hollow light-transparent element 36 made of glass material according to FIG. 33. The light-transparent element 36 has an inert gas like xenon or a liquid dye or a fluorescent compound like light-polarizing compound injected into an internal portion thereof. The steps of the seventh embodiment further comprise setting a total-reflection metal layer 37 on between the rear face of the LED chip 10 and a bottom face of the light-transparent element 36 and a half-reflection metal layer 38 on a top face of the light-transparent element 36.

Referring to FIG. 34, the steps of the seventh embodiment comprise setting a transparent viscous material (not shown in drawing) between the rear face 101 of the LED chip 10 and the total-reflection metal layer 37. The light-transparent element 36 is disposed on the transparent viscous material. The light-transparent element 36 is made of any transparent insulative material such as, for example, transparent epoxy resin, polyidmide or polyvinyl chloride. When the light-transparent element 36 is made of transparent insulating material, the transparent insulating material is doped with a light-polarizing compound.

Although the present invention has been described with reference to the preferred embodiment thereof, it will be understood that the invention is not limited to the details thereof. Various substitutions and modification have suggested in the foregoing description, and other will occur to those of ordinary skill in the art. Therefore, all such substitutions and modifications are intended to be embraced within the scope of the invention as defined in the appended claims.

What is claimed is:

1. A light-emitting diode chip package body, comprising:
   an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole;
   a substrate insulative layer disposed on the chip-installed surface to form an open hole for exposure of a central scope of the at least one chip-installed scope;
   at least one light-emitting diode chip disposed on the at least one chip-installed scope of the insulative substrate, and having a pad-installed surface formed thereon, a plurality of pads installed on the pad-installed surface and a rear surface formed on an opposite side of the pad-installed surface;

a light-reflecting coating disposed on the pad-installed surface and having a plurality of pad-exposed holes for exposure of the corresponding pads of the at least one light-emitting diode chip;

a plurality of conductive projecting blocks, each of the conductive projecting blocks being disposed on the corresponding pad of the at least one light-emitting diode chip and electrically connected to the corresponding conductive tracks;

a heat-conducting layer formed between the insulative substrate and the pad-installed surface of the at least one light-emitting diode chip;

and a light-transparent element disposed on the rear face of the at least one light-emitting diode chip.

2. The package body as claimed in claim 1, further comprising a light-reflecting coating formed on an internal wall of the open hole.

3. The package body as claimed in claim 1, further comprising a plurality of conductive bodies, wherein the conductive projecting blocks are electrically connected to the corresponding conductive tracks by the corresponding conductive bodies.

4. The package body as claimed in claim 1, wherein the heat-conducting layer is made of an insulator material and a heat-conductive material.

5. The package body as claimed in claim 1, wherein the heat-conducting layer is made of non-metal-insulator material and heat-conductive material.

6. The package body as claimed in claim 1, wherein the light-transparent element has dye powder doped therein.

7. The package body as claimed in claim 1, wherein each of the conductive projecting blocks comprises: a protrusion made of a nonconductive material and disposed on the corresponding pad of the light-emitting diode chip; a first metal layer formed on the corresponding pad of the light-emitting diode chip for covering a corresponding surface of the pad and the protrusion of the corresponding pad; and a second metal layer formed on the corresponding first metal layer.

8. The package body as claimed in claim 7, wherein each of the second metal layers is composed of a nickel layer and a gold layer.

9. The package body as claimed in claim 1, further comprising a bonded metal layer formed on the corresponding pad.

10. The package body as claimed in claim 9, wherein each of the conductive projecting blocks comprises: a protrusion made of a nonconductive material and disposed on the corresponding bonded metal layer; a first metal layer formed on the corresponding bonded metal layer for covering a corresponding surface of the bonded metal layer and the protrusion of the corresponding bonded metal layer; and a second metal layer formed on the corresponding first metal layer.

11. The package body as claimed in claim 10, wherein each of the second metal layers is composed of a nickel layer and a gold layer.

12. The package body as claimed in claim 1, wherein the conductive projecting blocks are made of gold.

13. The package body as claimed in claim 1, wherein each of the conductive projecting blocks comprises: a conductive contact point disposed on the corresponding pad of the light-emitting diode chip; and a conductive welded point disposed on the corresponding conductive contact point.

14. A light-emitting diode chip package body, comprising:

an insulative substrate including at least one chip-installed scope, the at least one chip-installed scope having a chip-installed surface, a rear face formed opposite the chip-installed surface, a through hole penetrating through the chip-installed surface and the rear face and a plurality of conductive tracks extending from the chip-installed surface to the rear face through the through hole;

a substrate insulative layer disposed on the chip-installed surface to form an open hole for exposure of a central scope of the at least one chip-installed scope;

at least one light-emitting diode chip disposed on the at least one chip-installed scope of the insulative substrate, and having a pad-installed surface formed thereon, a plurality of pads installed on the pad-installed surface and a rear surface formed on an opposite side of the pad-installed surface;

a light-reflecting coating disposed on the pad-installed surface and having a plurality of pad-exposed holes for exposure of the corresponding pads of the at least one light-emitting diode chip;

a plurality of conductive projecting blocks, each of the conductive projecting blocks being disposed on the corresponding pad of the at least one light-emitting diode chip and electrically connected to the corresponding conductive tracks;

a heat-conducting layer formed between the insulative substrate and the at least one light-emitting diode chip; and a light-transparent element disposed on the rear face of the at least one light-emitting diode chip;

wherein each of said conductive projecting blocks includes:

a protrusion made of a nonconductive material and disposed on the corresponding pad of the light-emitting diode chip, a first metal layer formed on the corresponding pad of the light-emitting diode chip for covering a corresponding surface of the pad and the protrusion of the corresponding pad, and a second metal layer formed on the corresponding first metal layer.

15. The package body as claimed in claim 14, wherein said second metal layer is composed of a nickel layer and a gold layer.

* * * * *